United States Patent [19]

Machida et al.

[11] Patent Number: 4,896,111

[45] Date of Patent: Jan. 23, 1990

[54] METHOD AND SYSTEM FOR IMPROVING RESOLUTION OF IMAGES IN MAGNETIC RESONANCE IMAGING

[75] Inventors: Yoshio Machida; Kyojiro Nanbu, both of Tochigi, Japan

[73] Assignee: Kabushiki Kaisha Toshiba, Kawasaki, Japan

[21] Appl. No.: 278,453

[22] Filed: Dec. 1, 1988

[30] Foreign Application Priority Data

Dec. 2, 1987 [JP] Japan ................. 62-305286

[51] Int. Cl.$^4$ ............................................ G01R 33/20
[52] U.S. Cl. .................................................. 324/309
[58] Field of Search .............. 324/300, 307, 309, 312, 324/313, 314; 128/653

[56] References Cited
U.S. PATENT DOCUMENTS 4,684,891  8/1987  Feinberg .............................. 324/307
4,737,714  4/1988  Hanawa ............................... 324/309

OTHER PUBLICATIONS

ANDO et al., "Ultra-Resolution (Principle and Algorithm)", Measurement and Control, vol. 22, No. 10 (1983), pp. 4–12.

Primary Examiner—Michael J. Tokar
Attorney, Agent, or Firm—Foley & Lardner, Schwartz, Jeffery, Schwaab, Mack, Blumenthal & Evans

[57] ABSTRACT

In the magnetic resonance imaging, magnetic resonance (MR) signals generated from a predetermined region of a subject are detected by using the selective excitation method. The estimation of the subject is performed by executing the repetition solution in accordance with the spectral data of detected MR signal and region data representing the region of the subject. The MR image having the high resolution than the conventional MR image is obtained.

5 Claims, 8 Drawing Sheets

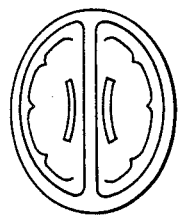
F I G. 1A
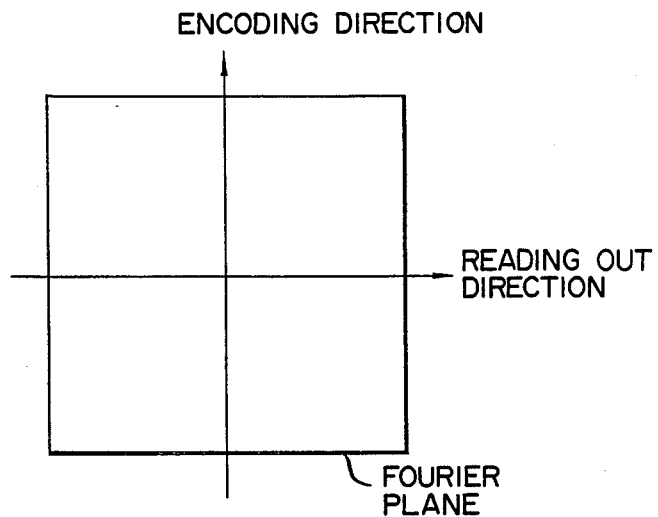
F I G. 1B
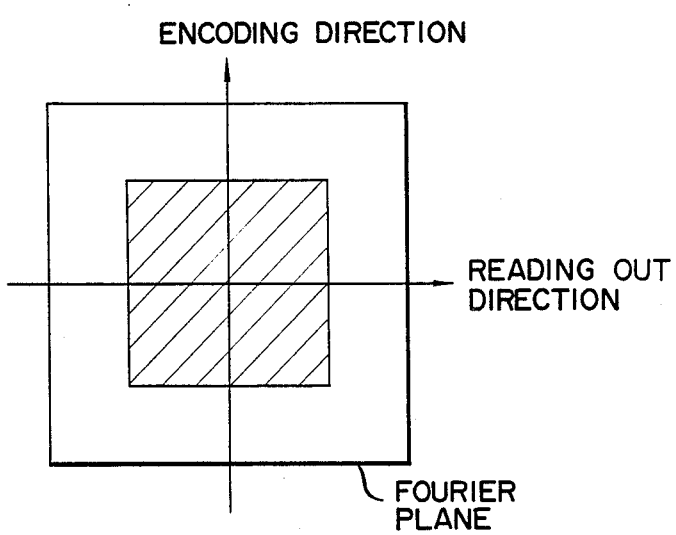
F I G. 2

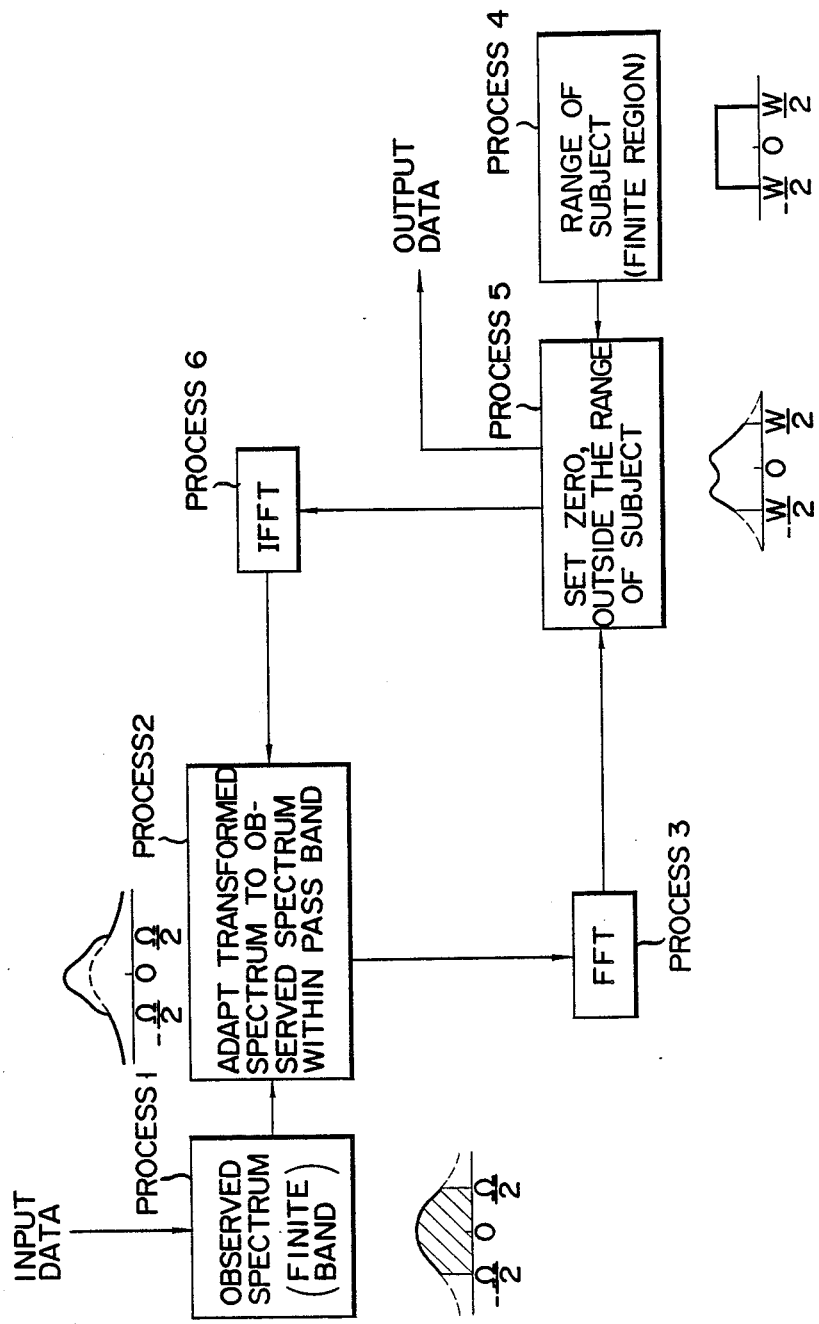
F I G. 4

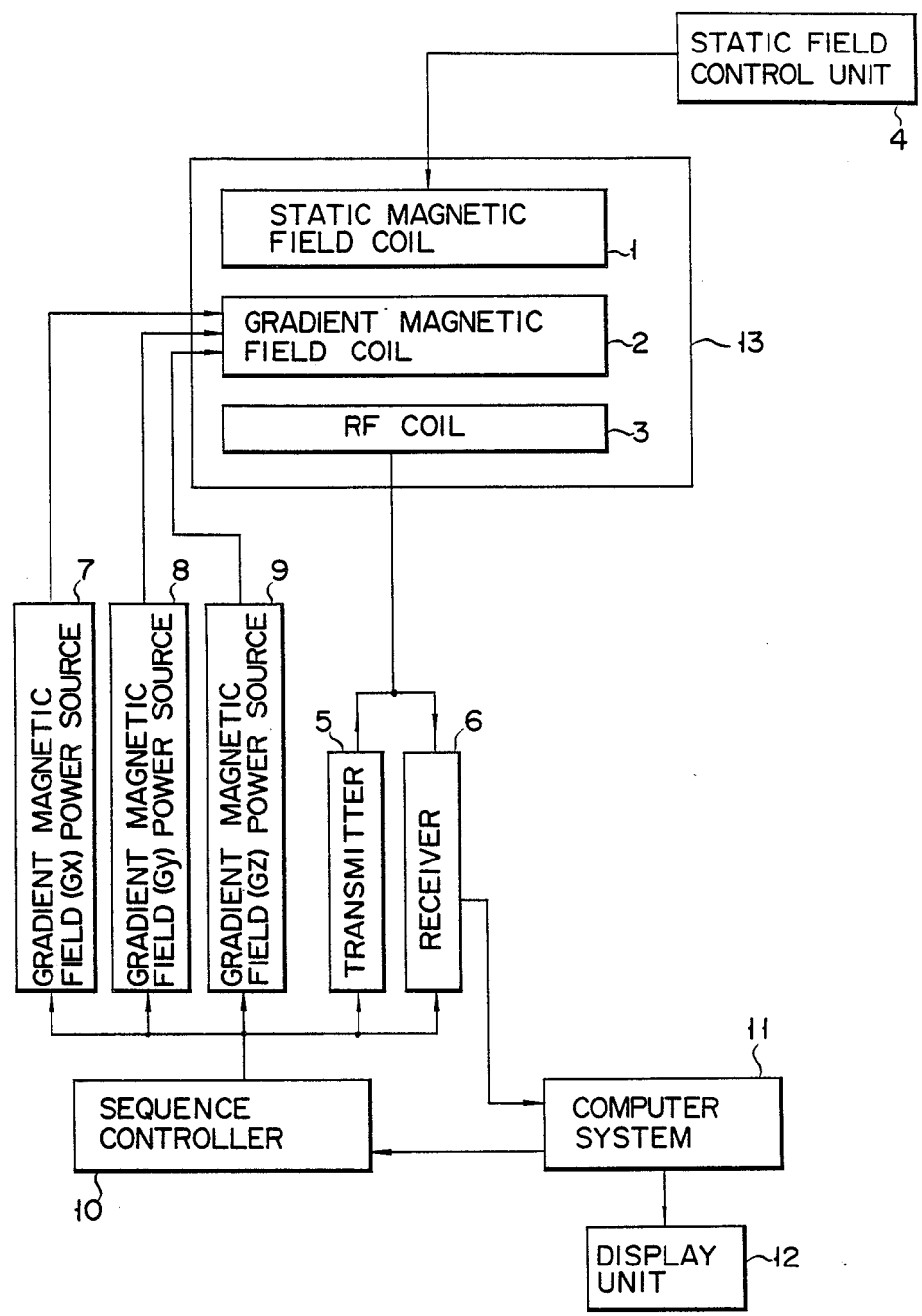
F I G. 9

METHOD AND SYSTEM FOR IMPROVING RESOLUTION OF IMAGES IN MAGNETIC RESONANCE IMAGING

BACKGROUND OF THE INVENTION

1. Field of the Invention

The present invention relates to a method and system for improving resolution of images in magnetic resonance imaging (MRI).

2. Description of the Related Art

Magnetic resonance (MR) is a phenomenon exhibited by atomic nuclei which are placed in a static magnetic field and have a nonzero magnetic moment whereby the atomic nuclei absorb and emit electro-magnetic energy only at specific frequencies through their resonance. The atomic nuclei resonate at an angular frequency $\omega o$ ($\omega o = 2\pi \nu$, $\nu =$ Larmor frequency) given by $$\omega o = \gamma Ho \quad (1)$$

where $\gamma$ is the gyromagnetic ratio inherent in each type of nucleus and Ho is the strength of the applied static magnetic field.

MRI apparatus utilizing the magnetic resonance phenomenon have been in wide use for medical diagnosis. An MRI apparatus detects MR signals after the resonance absorption and processes the MR signals to obtain diagnostic information, for example, slice images of a subject resulting from the density of nuclei, longitudinal relaxation time, transverse relaxation time, flow and chemical shifts, noninvasively.

The diagnostic information may be acquired by exciting the whole body of the subject placed in the static magnetic field. In practice, however, the diagnostic information is obtained by exciting only a specific portion of the subject because of limitations on the arrangement of the MRI apparatus and clinical demands for acquired images.

A high resolution version of MR images will now be discussed. The MR signals observed by the MRI correspond to points on the K space of a subject (see FIG. 1A), namely, on a frequency region (Fourier plane) having a readout direction and a phase encoding direction as shown in FIG. 1B. In FIG. 1B, the end of the frequency region corresponds to high frequency components in the subject. Hence, to estimate the original subject at high resolution, in other words, to improve resolution of reconstructed MR images, the MRI device must acquire MR data over a wide frequency range. For example, as shown in FIG. 2, images reconstructed from MR data within a narrow frequency range (hatching portion) blur.

The position of data in the K space is proportional to an integral amount of the strength of a gradient magnetic field applied to spins in the subject. To observe the high frequency components of the original data, a large integral amount of gradient magnetic field is needed. To increase the integral amount of the gradient magnetic field, the strength or application time period of the gradient magnetic field must be increased. When the application time period of the gradient magnetic field is increased, the strength of MR signals decrease because of the effect of the transverse relaxation time. Further, echo time is an important parameter relating to induction of the MR signals and thus increase of the application time is limited. For this reason, the strength of the gradient magnetic field is increased in order to increase the integral amount of the gradient magnetic field. As a result, the high frequency components of the original data are observed, and it is possible to realize a high resolution version of the MR images. However, this leads to the necessity of a large capacity power supply source for generating the gradient magnetic field. This power supply source is not a practical apparatus from the standpoint of the arrangement of the MRI apparatus.

An MRI apparatus is according desired which can improve resolution of images without the need of a large-capacity power supply source.

SUMMARY OF THE INVENTION

It is accordingly an object of the present invention to provide a method of improving resolution of images without the need of a large-capacity power supply source and a system for executing the method.

According to one aspect of the present invention, there is provided a system for estimating a magnetic resonance signal, the system comprising: static field generating means for generating a static field; gradient field generating means for generating gradient fields; transmitting and receiving means for transmitting an excitation pulse to a subject and for receiving a magnetic resonance signal generated in the subject; control means for controlling the static field generating means, the gradient field generating means, and the transmitting and receiving means in accordance with a predetermined sequence; setting means for setting a region of the subject in accordance with the predetermined sequence, and estimating means for estimating the magnetic resonance signal received by the transmitting and receiving means in accordance with the set region.

According to another aspect of the present invention, there is provided a method for estimating a magnetic resonance signal, the method comprising the steps of: setting a pulse sequence to obtain a subject region; canceling a transverse magnetization component in a region around the subject region after an excitation pulse is applied to the region around the region in accordance with the pulse sequence; acquiring a magnetic resonance signal generated by applying the excitation pulse to the subject region in accordance with the pulse sequence; and estimating the acquired magnetic resonance signal by the subject.

BRIEF DESCRIPTION OF THE DRAWINGS

FIG. 1A shows an example of a subject for diagnosis;

FIG. 1B shows a conceptional view of the K space (frequency region);

FIG. 2 shows a conceptional view of a range of data used for reconstructing an image in the frequency region;

FIG. 4 is a functional block diagram used for explaining a repetition process in ultra-resolution;

FIG. 9 is a block diagram of an MRI apparatus;

DETAILED DESCRIPTION OF THE PREFERRED EMBODIMENT

An embodiment of the present invention will be described with reference to the drawings hereinafter.

First, the principle of ultra-resolution will be described. In ultra-resolution, if an original image f is represented by a finite function, then the Fourier transform F of the original image will be represented by an analytic function. Here, a "finite function" means a continuous function whose non-zero-valued region is included in a closed interval. In an analytic function, if its values are found on an open interval, then, the Fourier transform F based on the original image f can be estimated through analytic continuation.

Figure 3A:
FIGS. 3A, 3B, 3C, 3D and 3E are diagrams used for explaining the principle of ultra-resolution.
Figure 3B:
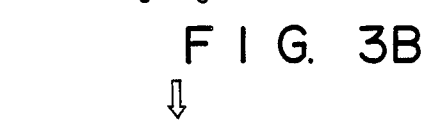
Figure 3D:
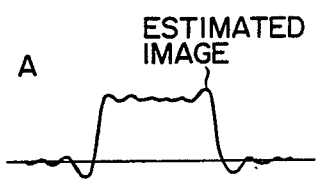
Figure 3C:
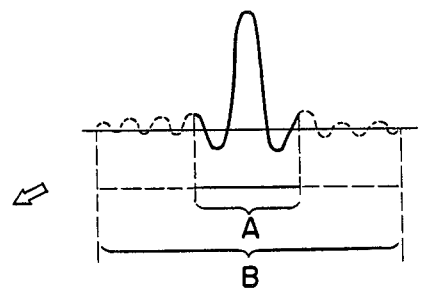
Figure 3E:
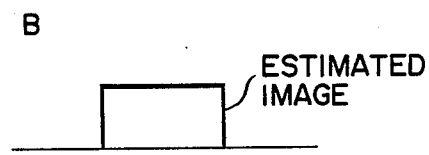
Figure 5:
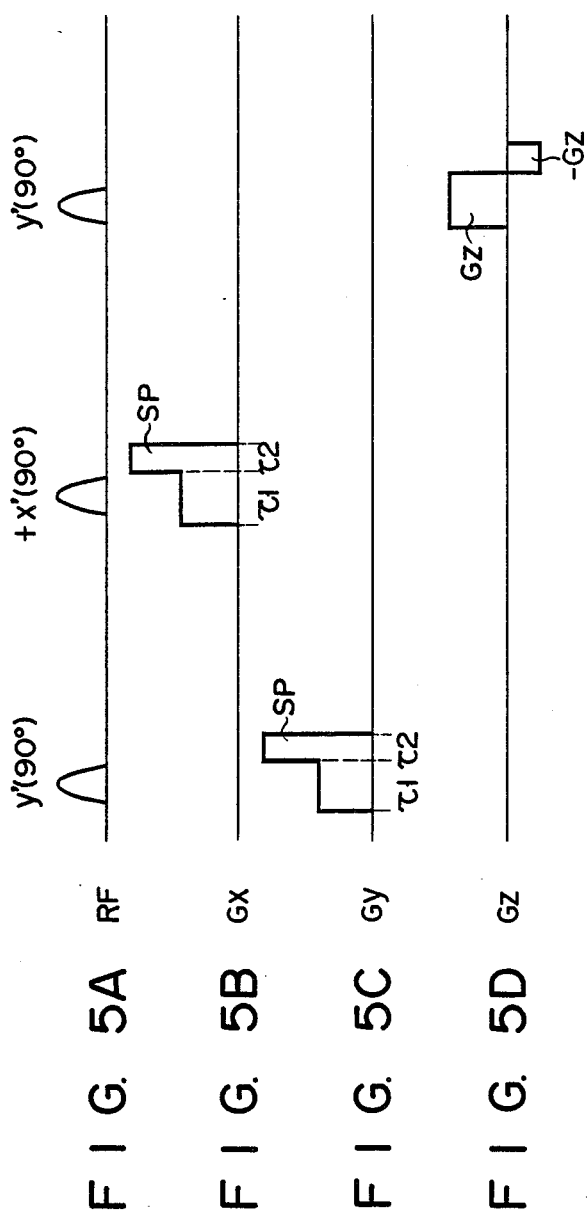
FIGS. 5A, 5B, 5C, 5D show a pulse sequence in a selective excitation method.

When an original subject as shown in FIG. 3A is supposed, a frequency spectrum for the original subject, as shown in FIG. 3B, will be represented by an analytic function. If the original subject is estimated on the basis of only frequency components within a frequency range A (shown in FIG. 3C) in the frequency spectrum shown in FIG. 3B, high frequency components would be lost as shown in FIG. 3D. The analytic continuation may be applied to the analytic function. Therefore, if the analytic continuation for frequency components within a frequency range B of FIG. 3C is performed, the original subject can be estimated accurately as shown in FIG. 3E.

As practical algorithms for the above analytic continuation, the repetition method is widely used because of its easiness of operations. That is, according to "Ultra—Resolution——the Principle and Algorithm-", by Shigeru Ando, and Yasuhiro Doi, Measurement and Control, vol. 22, No. 10, 1983, as shown in FIG. 4, spectrum data is read over a finite band $[-\Omega/2, \Omega/2]$ in process 1 and then a fast Fourier transform (FFT) is performed in process 3 via process 2. Subsequently, in process 4, region data about a range $[31\ W/2, W/2]$ of a subject is obtained by a method to be described later. The region data is applied to the result of the FFT operation obtained by process 3 and thus components outside the range of the subject are set to zero in process 5.

After the completion of an IFFT (inverse fast Fourier transform) operation in process 6, the result of operation in process 6 is processed to coincide with the observed spectrum within a passband $[-\Omega/2, \Omega/2]$ in process 2. That is, the waveform of the spectrum within the passband is processed to coincide with the originally observed spectrum while the spectrum waveform outside the passband is left. The above processes $(3 \rightarrow 5 \rightarrow 6 \rightarrow 2 \rightarrow 3 \rightarrow \ldots)$ are repeated and data in process 5 is acquired as estimated data.

To apply the principle of ultra-resolution to the MRI technique, a method of observing a spectrum and a method of determining the existence region of a subject are needed. Since the MRI apparatus is inherently a spectrum observation apparatus, the spectrum can readily be observed. Hence the method of determining the existence region of the subject is left to be solved. The localizing method disclosed in U.S. Pat. No. 4,737,714 is used as the method of determining the existence region of the subject.

In accordance with the localizing method, the outside of a predetermined local region is magnetically nonexisted by the application of gradient magnetic fields, and MR signals generated from the local region only are acquired. That is, the local region is defined as the existence region of the subject.

Figure 6:
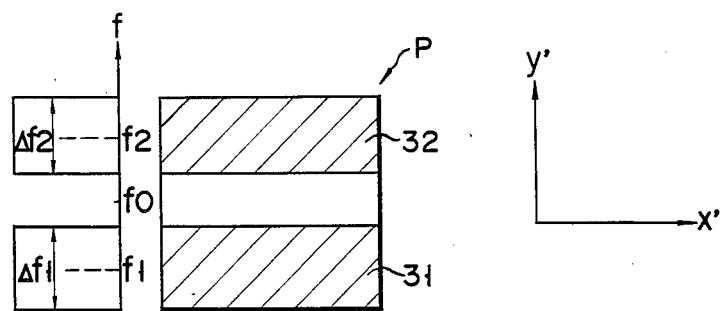
FIGS. 6, 7 and 8 are diagrams for explaining the selective excitation method.

In the localizing method, in order to obtain a tomogram image in a predetermined position of a subject under examination, a static magnetic field is generated in the Z axis and the subject is placed in the static magnetic field. The magnetization is created in the direction of the Z axis. Subsequently magnetic fields used for specifying the direction of the magnetization and the position of a slice of the subject are added to the static magnetic field. In the following the rotating coordinate system (X', Y', and Z') is used In the rotating coordinate system, to cause the magnetization to tip 90° in the minus direction of the X' axis, an RF pulse (90° pulse) is applied in the direction of Y'. At the same time a slicing gradient field Gy is added. The RF pulse includes two frequencies f1 and f2. That is, in FIGS. 5A through 5D and FIG. 6, when the center frequency of the RF pulse applied to the subject P in order to excite a region including the local portion is f0, the RF pulse includes frequencies f1 and f2 to select regions 31 and 32 (hatched portions in FIG. 6) on both sides of the local portion. In this case, f1 and f2 are center frequencies and the excitation widths are determined by Δf1 and Δf2. The reason why an RF pulse with different frequencies is used to select a predetermined region as described above will be apparent from the following equations.

$$\omega_0 = \gamma H_0 \quad (2)$$

$$f_0 = (\gamma/2\pi) \cdot H_0 \quad (3)$$

The slicing gradient field Gy is applied only during a predetermined time interval τ1 and subsequently a gradient field (referred to as a spoiler SP) having a sufficiently great strength is applied during a predetermined time interval τ2. As a result, the transverse magnetization component disappears.

The regions 31 and 32 have slice thicknesses Δt1 and Δt2, in the direction of the Y axis, respectively, Δt1 and Δt2 are given by $$\Delta t_1 = \Delta f_1 / ((\gamma/2\pi) \cdot G_y) \quad (4)$$

$$\Delta t_2 = \Delta f_2 / ((\gamma/2\pi) \cdot G_y) \quad (5)$$

Figure 7:
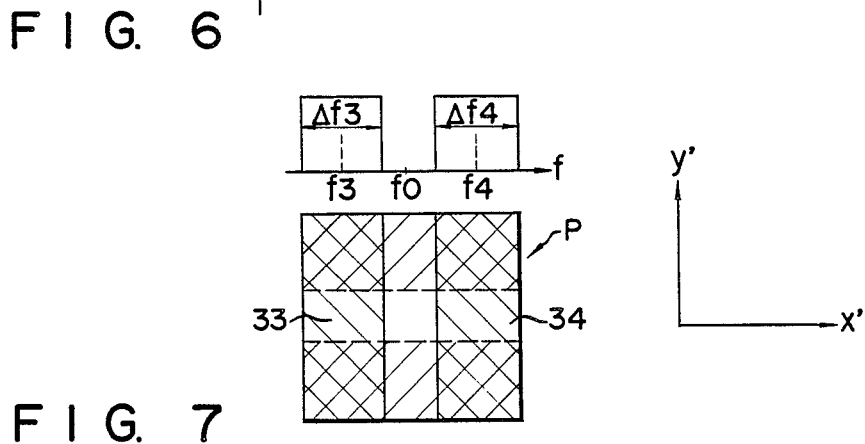

Next, to select regions 33 and 34 shown in FIG. 7, a 90° RF pulse is applied in the X' direction so as to tip the magnetization in the Y' direction and, at the same time, a slicing gradient field Gx is applied. At that time, an RF pulse having two different frequencies f3 and f4 (frequency bandwidths of Δf3 and Δf4) on both sides of center frequency f0 is applied and the gradient field Gx is made to have the slicing field strength in the interval τ1 and the spoiler SP in the interval τ2. Therefore, the magnetizations in regions 33 and 34 which had once be excited will disappear.

Figure 8:
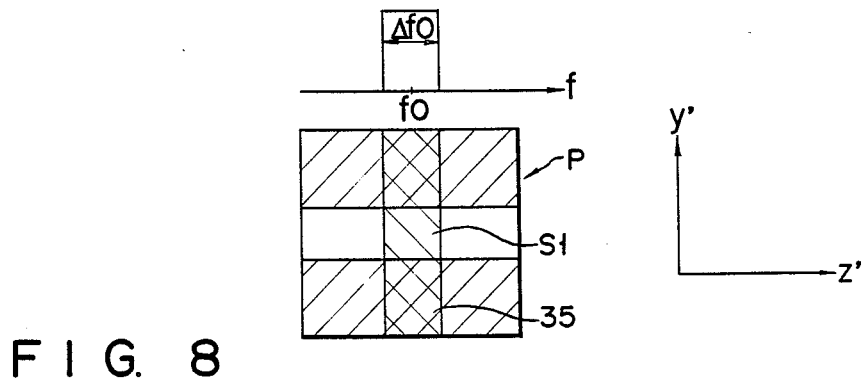

Moreover, as shown in FIG. 8, after the lapse of a predetermined time, an RF pulse with a center frequency of f0 (band of Δf0) is applied in the direction of the Z axis to selectively excite center region 35 and a gradient magnetic field Gz is applied. Afterward, MR signals are detected by a series of pulses used for a normal imaging (not shown). At this time, since the magnetizations in other regions have disappeared, the regions outside the local portion S1 are made nonexistent and thus only MR signals produced from local portion S1 are acquired. With the selective excitation method, a portion from which MR signals are generated specifies the substantial existence region of a subject on an image. The method can thus determine the existence region of the subject in advance.

The MRI method having both the ultra-resolution and the selective excitation methods was theoretically considered hereinbefore. Next a specific embodiment of the present invention will be described.

As shown in FIG. 9, coil system 13 into which a subject can be disposed is made of a normal conductive or a super-conductive material or the like and includes static field coil 1 (a shim coil for correcting a static field is sometimes added) for generating a static magnetic field, gradient magnetic field coil 2 for generating gradient magnetic fields for adding position information of a portion in which MR signals are induced and RF coil 3 for transmitting RF pulses to the subject and for detecting the MR signals induced within the subject. The present MRI system further includes static field control unit 4 for supplying a current to static field coil 1, transmitter 5 for transmitting the RF pulses, receiver 6 for receiving the MR signals, gradient magnetic field power sources 7, 8, 9 for supplying a current to coils 2 for generating gradient magnetic fields in the directions of the X, Y, and Z axes, sequence controller 10 for controlling a pulse sequence for local excitation as shown FIGS. 5A through 5D, computer system 11 for controlling sequence controller 10 and for processing the MR signals received by receiver 6 and display unit 12 for displaying the result of the MR signal processing.

Figure 10:
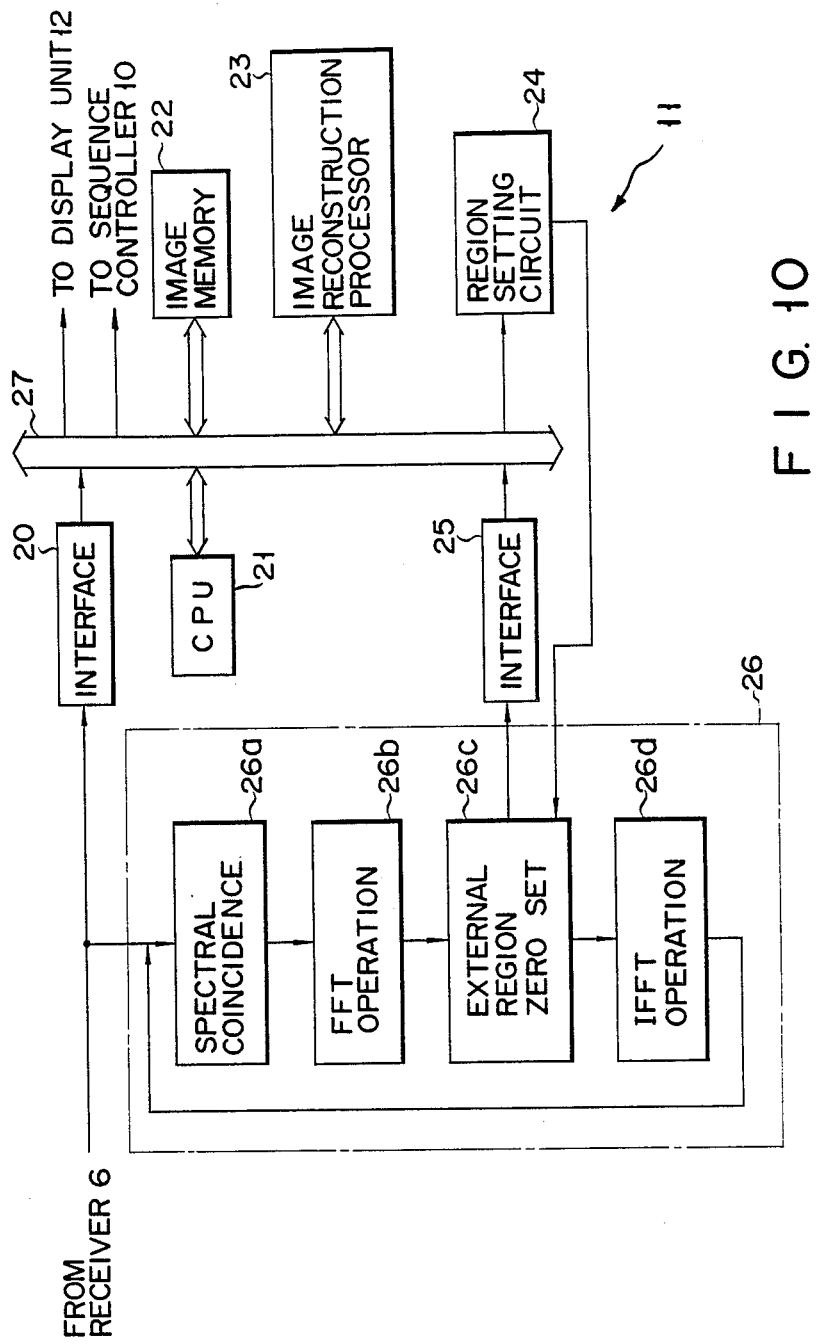
FIG. 10 is a block diagram of a computer system of the present invention.

As shown in FIG. 10, computer system 11 includes CPU 21 for controlling the whole system via data bus 27, image memory 22 for storing signals output from receiver 6 via interface 20, image reconstruction processor 23 for reconstructing two-dimensional images and the like in accordance with data stored in image memory 22, ultra-resolution processor 26 for ultra-resolution processing, interface 25 and region setting circuit 24 for setting the region of a subject to be processed using ultra-resolution. Ultra-resolution processor 26 includes functional blocks of spectral coincidence block 26a, FFT operation block 26b, external-region-zero-set block 26c and IFFT operation block 26d.

Figure 11:
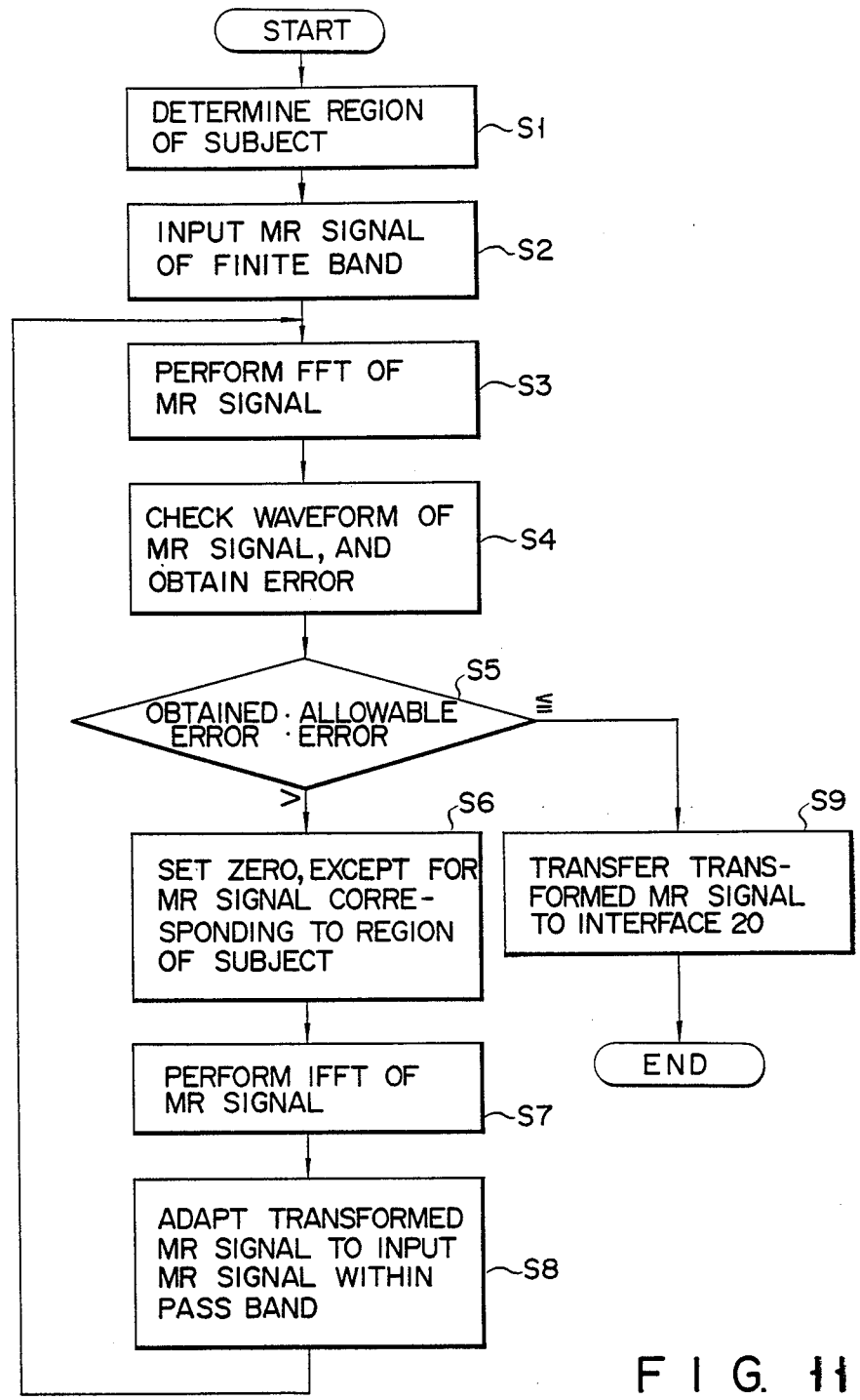
FIG. 11 is a flowchart showing the operation of the computer system.

The operation of the present system will be described with reference to a flowchart shown in FIG. 11.

In step S1, the region of an object is determined by a pulse sequence of the selective excitation method. In step S2, MR signals are input from receiver 6 to ultra-resolution processor 26.

In step S3, the MR signals are subjected to FFT and, in step S4, an error is acquired by examining the waveform of the transformed MR signals. In step S5, the error obtained in step S4 is compared with a preset allowable error.

When the error obtained in step S5 is larger than the allowable error, the MR signals are set to zero except for MR signals corresponding to the region of the subject in step S6. The MR signals corresponding to the region of the subject are subjected to IFFT in step S7 and subsequently the MR signals input in step S1 are adapted to the transformed MR signals within the pass band in step S8. After step S8 is completed, step S3 and the subsequent steps are performed again.

If the obtained error is below the allowable error in step S5, then the transformed MR signals are transferred to interface 20 in step S9.

The subject is estimated by the above ultra-resolution process. A two dimensional image is acquired by using two dimensional FFT and IFFT.

With such an arrangement, by placing the subject in the static field and operating sequence controller 10, the pulse sequence shown in FIGS. 5A through 5D is carried out. As a result, transmitter 5 is driven to transmit RF pulses through RF coil 3, gradient magnetic field power sources 7, 8, 9 are driven to apply gradient fields Gx, Gy and Gz through gradient field coil 2, and the MR signals from the local portion of the subject are detected by RF coil 3.

In the embodiment of the present invention described herein, the MR data is acquired by repeating the local exciting pulse sequence shown in FIGS. 5A through 5D a predetermined number of times. The local region is set in region setting circuit 24 by executing the pulse sequence. The MR data obtained through the pulse sequence is input into ultra-resolution processor 26 to carry out the processes shown in FIG. 11 and is then stored in image memory 22 via data bus 27. Furthermore, MR images are constructed by image-reconstruction processor 23 and then displayed by display unit 12.

Although the preferred embodiment of the present invention has been disclosed and described, it is apparent that other embodiments and modifications are possible.

According to the present embodiment, the MR signals can be acquired only from a local portion by the selective excitation method for specifying the existence region of a subject, namely, the region for imaging. The MR signal processing is performed by using the ultra-resolution method on the basis of region data representing the region of the subject obtained by the selective excitation method. Therefore, the present invention permits high resolution imaging by MR signals from a narrow region, without large-capacity power sources for the gradient magnetic fields and the like. Further, a small-capacity gradient field power source can now be used without lowering the resolution. It is possible to realize high resolution imaging in a short echo time. The ultra-resolution process may be performed after the acquired MR data is stored in the image memory. A three dimensional MR image may be reconstructed by a combination of the ultra-resolution method and the selective excitation method.

What is claimed is:

1. A system for acquiring a magnetic resonance image by estimating components in a magnetic resonance signal outside a range, the range corresponding to a region of a subject, the system comprising:

static field generating means for generating a static field;

gradient field generating means for generating gradient fields;

transmitting and receiving means for transmitting an excitation pulse to the subject and for receiving a magnetic resonance signal generated in the subject;

control means for controlling the static field generating means, the gradient field generating means, and the transmitting and receiving means in accordance with a predetermined sequence;

setting means for setting a set region of the subject in accordance with the predetermined sequence; and estimating means for estimating the magnetic resonance signal received by the transmitting and receiving means in accordance with the set region;

wherein the estimating means includes;

first transforming means for Fourier-transforming the magnetic resonance signal;

zero-setting means for setting components outside the range in a magnetic resonance signal transformed by the first transforming means to zero;

second transforming means for Inverse Fourier-transforming a magnetic resonance signal zero-set by the zero-setting means; and fitting means for fitting a magnetic resonance signal transformed by the second transforming means to the magnetic resonance signal received by the transmitting and receiving means within the range.

2. A method for acquiring a magnetic resonance image by estimating components in a magnetic resonance signal outside a range, the range corresponding to a subject region, the method comprising the steps of:

setting a pulse sequence to obtain the subject region;

canceling a transverse magnetization component in a region around the subject region after an excitation pulse is applied to the region around the subject region in accordance with the pulse sequence;

acquiring a magnetic resonance signal generated by applying the excitation pulse to the subject region in accordance with the pulse sequence; and estimating an acquired magnetic resonance signal acquired from the subject region, wherein the estimating step includes the steps of;

(a) first-transforming a magnetic resonance signal;

(b) setting components outside the range in a first-transformed magnetic resonance signal to zero;

(c) second-transforming a zero-set magnetic resonance signal; and (d) fitting a second-transformed magnetic resonance signal to a received magnetic resonance signal within the range.

3. A method according to claim 2, wherein steps (a) through (d) are repeated at least one additional time.

4. A method for acquiring a magnetic resonance image by estimating components in a magnetic resonance signal outside a range, the range corresponding to a subject region, the method comprising the steps of:

setting the subject region of a subject in accordance with a pulse sequence; acquiring a magnetic resonance signal generated by applying an excitation pulse to the subject region in accordance with the pulse sequence; and estimating an acquired magnetic resonance signal acquired from the subject region; wherein the estimating step includes the steps of;

(a) first-transforming a magnetic resonance signal;

(b) setting components outside the range in a first-transformed magnetic resonance signal to zero;

(c) second-transforming a zero-set magnetic resonance signal; and (d) fitting a second-transformed magnetic resonance signal to a received magnetic resonance signal within the range.

5. A method according to claim 4, wherein steps (a) through (d) are repeated at least one additional time.

* * * * *